(12) United States Patent
Zaky et al.

(10) Patent No.: US 10,659,048 B2
(45) Date of Patent: May 19, 2020

(54) MIXED SIGNAL SYSTEM

(71) Applicant: InvenSense, Inc., San Jose, CA (US)

(72) Inventors: Amr Zaky, San Jose, CA (US); Hou-Yi Wang, Cupertino, CA (US); Sarvesh Shrivastava, Sunnyvale, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/193,752

(22) Filed: Nov. 16, 2018

(65) Prior Publication Data

US 2019/0207608 A1   Jul. 4, 2019

Related U.S. Application Data

(60) Provisional application No. 62/611,348, filed on Dec. 28, 2017.

(51) Int. Cl.
*H03L 5/00*   (2006.01)
*H03K 19/0175*   (2006.01)
*H03M 1/66*   (2006.01)
*H03K 19/20*   (2006.01)

(52) U.S. Cl.
CPC ...... *H03K 19/017509* (2013.01); *H03M 1/66* (2013.01); *H03K 19/20* (2013.01)

(58) Field of Classification Search
CPC .. H03K 19/017509; H03K 19/20; H03M 1/66
USPC .......................................................... 327/333
See application file for complete search history.

(56) References Cited

U.S. PATENT DOCUMENTS

| 2014/0254297 | A1* | 9/2014 | Hung | G11C 29/04 365/200 |
| 2019/0207608 | A1* | 7/2019 | Zaky | H03K 19/017509 |
| 2019/0254297 | A1* | 8/2019 | Clerx | A23B 4/062 |

* cited by examiner

Primary Examiner — Ryan Jager

(57) ABSTRACT

A mixed signal system includes a digital domain and an analog domain. The analog domain includes a plurality of BARs. Each BAR includes addressable registers. The digital domain includes an interface configured to communicate with the analog domain, e.g., write data to an addressable register within a BAR by transmitting a first select signal to select a first BAR of the plurality of BARs. The interface transmits an address of the addressable register of the first BAR and broadcasts the write data to the first BAR and at least one BAR other than the first BAR. The analog domain transmits data from a second BAR of the plurality of BARs to the digital domain by gating a select BAR signal associated with each BAR with its corresponding content stored therein to form respective BAR output and further by gating the respective BAR outputs with one another.

20 Claims, 5 Drawing Sheets

MIXED SIGNAL SYSTEM

BACKGROUND

Many electronic systems, e.g., sensor technology, use a mix of digital and analog domains. Generally, the analog blocks of a sensor chip are configured from the digital domain. As such, digital data and control signals are transmitted from, e.g., registers, the digital domain to the analog domain to configure the analog blocks. Typically, hundreds of control signals are driven from the digital domain to the analog domain in order to trim the sensor chip and tune the chip's functionality because the control signals typically originate in control registers of the digital domain. Not only the number of wires used to communicate data between the digital domain and the analog domain incurs area penalty, but that penalty is exacerbated because level shifters are required to change the voltage when entering and leaving each domain. Level shifters are generally large and take up valuable real estate. Many mixed signal systems also use multiplexers, that are generally large, in order to transmit data between the digital domain and the analog domain.

SUMMARY

Accordingly, there is a need to reduce the area and the footprint in a mixed signal system, such as a sensor chip, without sacrificing timing constraints and functionality. More specifically there is a need to reduce the area by reducing the number of wires, thereby the number of level shifters, as well as limiting or eliminating the use of multiplexers in the digital domain to transmit digital data to the analog domain. Furthermore, there is a need to efficiently read data from the analog domain into the digital domain.

In some embodiments, a mixed signal system includes a digital domain and an analog domain. The analog domain includes a plurality of block of addressable registers (BARs). Each BAR of the plurality of BARs includes at least one or more addressable registers. The digital domain comprises an interface configured to communicate with the analog domain. The interface is configured to write data to an addressable register within a BAR of the plurality of BARs in the analog domain by transmitting a first select signal configured to select a first BAR of the plurality of BARs. The interface is further configured to transmit an address of the addressable register of the first BAR and the interface is further configured to broadcast the write data to the first BAR and further to at least one BAR other than the first BAR of the plurality of BARs. The analog domain is configured to transmit data from a second BAR of the plurality of BARs to the digital domain by gating a select BAR signal associated with each BAR of the plurality of BARs with its corresponding content stored therein to form a respective BAR output and further by gating the respective BAR outputs with one another. Gating the select BAR signal associated with the second BAR and its content generates a non-zero respective BAR output and gating the select BAR signal associated with BARs of the plurality of BARs other than the second BAR generates a zero output.

In some embodiments, at least one logical OR gate is used to gate the respective BAR outputs. A select BAR signal associated with each BAR of the plurality of BARs and its corresponding content stored therein are AND gate together, in some embodiments. The addressable register may be a latch or a flipflop. The digital domain may further include one time programmable memory, where data is communicated from the one time programmable memory to the analog domain through the interface. The system may further include a level shifter configured to change voltages between the digital and analog domains.

It is appreciated that in some embodiments subsequent to transmitting the address of the addressable register, a bandwidth used to transmit the address of the addressable register is used for transmitting data until another select signal for writing data is transmitted from the digital domain to the analog domain. It is appreciated that in some embodiments, the respective BAR outputs are gated to one another in a daisy chain configuration wherein at least two respective BAR outputs of the respective BAR outputs are gated to one another and wherein output of the at least two respective BAR outputs is gated to at least another respective BAR output.

It is appreciated that a write operation in accordance with some embodiments includes transmitting a select signal, from a digital domain to an analog domain, for selecting a BAR from a plurality of BARs. The method further includes transmitting an address associated with an addressable register of the selected BAR from the digital domain to the analog domain, wherein the selected BAR comprises a plurality of addressable registers. The method also includes broadcasting write data to the plurality of BARs. The addressable register may be a latch or a flipflop or a combination thereof. The method further includes subsequent to transmitting the address of the addressable register, reusing a bandwidth used to transmit the address of the addressable register for transmitting the write data until another select signal for writing data is transmitted from the digital domain to the analog domain. The method may also include changing a voltage associated with signal being transmitted from the digital domain to the analog domain.

It is appreciated that a read operation in accordance with some embodiments includes receiving a first, a second, a third, and a fourth select signal associated with a first, a second, a third, and a fourth BARs respectively. Only one select signal is active at a time. Each BAR comprises at least one addressable register. The BARs and the at least one addressable register are within an analog domain. The method further includes receiving an address associated with an addressable register. The method also includes retrieving a content associated with the address. In some embodiments, the method includes gating the first, the second, the third, and the fourth select signal with content associated with the first, the second, the third, and the fourth BAR respectively to form a first, a second, a third, and a fourth BAR output. The first BAR output is gated with the second BAR output to form a first intermediate BAR output. The first intermediate BAR output is gated with the third BAR output to form a second intermediate BAR output. The second intermediate BAR output is gated with the fourth BAR output to form a data output. The method further includes outputting the data output from the analog domain to a digital domain.

In some embodiments, gating the select signal that is active with corresponding BAR content generates a non-zero output and gating all other select signals with corresponding BAR content generates a zero output. In some embodiments the first, the second, the third, and the fourth select signal are gated through an AND gate with content associated with the first, the second, the third, and the fourth BAR respectively. According to some embodiments, the first BAR output is OR gated with the second BAR output. Furthermore, in some embodiments the first intermediate BAR output is OR gated with the third BAR output. The method may further include changing a voltage of the data output when outputting the data output from the analog domain to the digital domain.

These and other features and advantages will be apparent from a reading of the following detailed description.

DESCRIPTION

Figure 1:
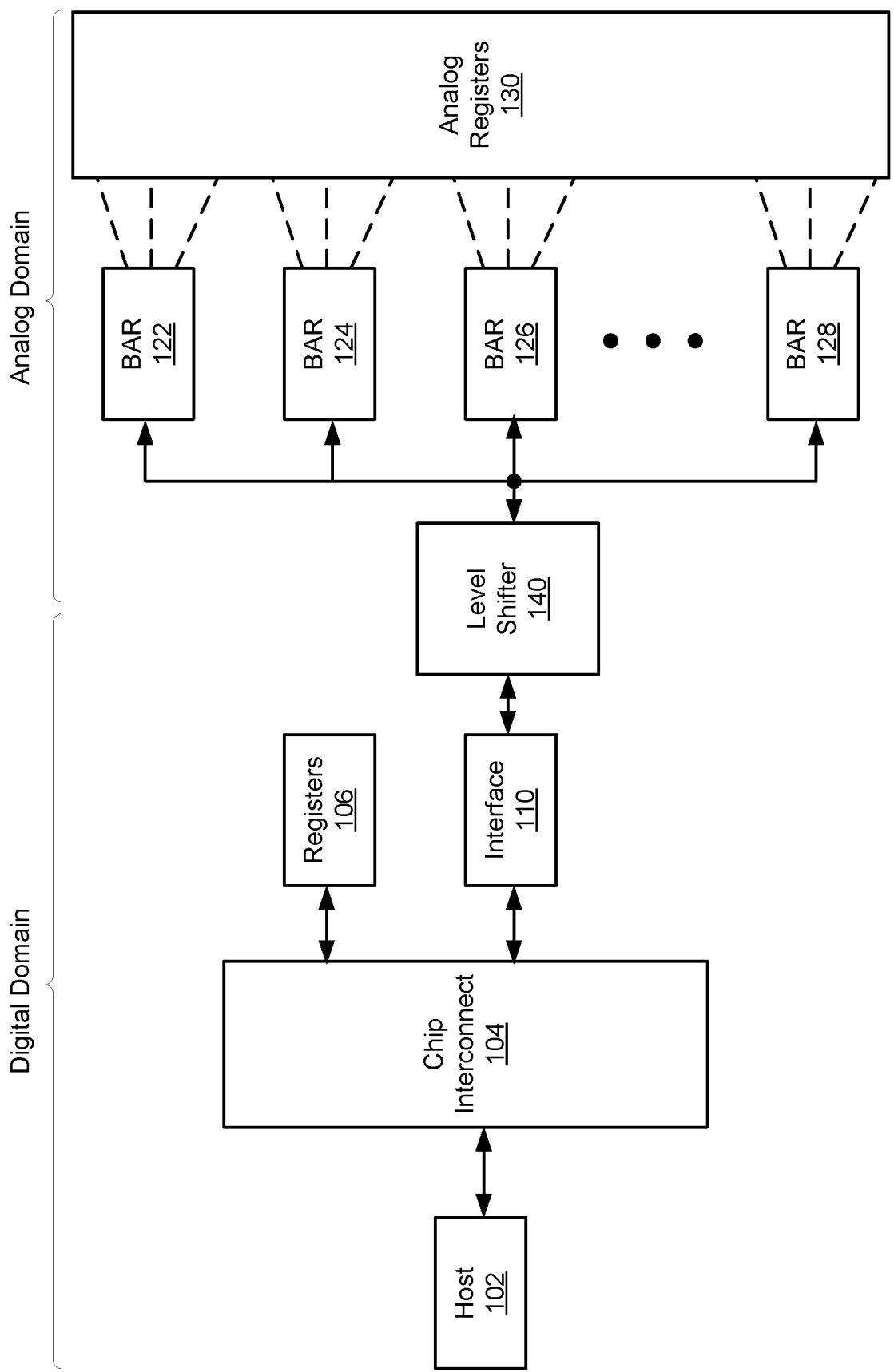
FIG. 1 shows an example of a mixed signal system according to some embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Sensors including micro-electro-mechanical systems ("MEMS") devices include mechanical elements as well electronics (e.g. electronics for sensing). MEMS devices include but are not limited to, for example, gyroscopes, accelerometers, magnetometers, pressure sensors, etc. Sensor technology uses a mix of digital and analog domains. Generally, the analog blocks of a sensor chip are configured from the digital domain. As such, digital data is transmitted from, e.g., registers, in the digital domain to the analog domain to configure the analog blocks. Typically, hundreds of control signals are driven from the digital domain to the analog domain in order to trim the sensor chip and tune the chip's functionality because the control signals typically originate in control registers of the digital domain. Not only the number of wires used to communicate data between the digital domain and the analog domain incurs area penalty, but that penalty is exacerbated because level shifters are required to change the voltage when entering and leaving each domain. Level shifters are generally large and take up valuable real estate. Many mixed signal systems also use multiplexers, that are generally large, in order to transmit data between the digital domain and the analog domain. It is appreciated that while the embodiments may reference sensor technology and/or sensor chip, the embodiments should not be construed as limited thereto. For example, the embodiments are applicable to any mixed signal system.

The embodiments reduce the area and the footprint in a mixed signal system, such as a sensor chip, without sacrificing timing constraints and functionality. More specifically, the embodiments reduce the area by reducing the number of wires, thereby the number of level shifters, as well as limiting or eliminating the use of multiplexers in communication between the digital domain and the analog domain. The embodiments also enable efficient data read from the analog domain into the digital domain.

The embodiments, achieve the above desirable goals by moving the registers, e.g., flipflops, latches, etc., from the digital domain to the analog domain, therefore reducing the number of required wires as well as the number of level shifters. The embodiments employ a novel method to write data from the digital domain into the analog domain. For example, an interface in the digital domain transmits a select signal that selects a particular block of addressable registers (BARs) in the analog domain. The interface may further transmit an address associated with an addressable register of the selected BAR in the analog domain. It is appreciated that the data may then be broadcast to all BARs within the analog domain. It is, however, appreciated that because only one BAR in the analog domain has been selected (via the select signal), the data will be written only into the selected BAR and into the intended register as identified by the transmitted address of the addressable register even though the data is being broadcast to all BARs within the analog domain. It is appreciated that the bandwidth associated with transmitting the address may be released, hence reused, to transmit data after the address has been transmitted. In some embodiments, the registers in the analog domain may be flipflops. However, in some embodiments the flipflops may be replaced with latches, therefore reducing the footprint even further.

The embodiments enable efficient data read, from the analog domain to the digital domain, by gating, e.g., logical AND gating, a select signal line associated with each BAR with its content. Thus, if the select signal line is asserted high, the content is output. It is appreciated that each BAR may also receive an address associated with the intended register that the data is to be read from. The output of a BAR may be gated, e.g., logical OR gate, with an output of another BAR and the output of the gate may be gated again with other BARs in the similar fashion. In other words, the output of a BAR is gated to another BAR and its output is gated to another BAR in a daisy chain fashion until outputs from all BARs within the analog domain are connected with one another. The ultimate output is the intended data to be read because each BAR outputs a zero that cascades through the daisy chain except for the only BAR that has the select signal asserted high with an address for the addressable register.

Referring now to FIG. 1, an example of a mixed signal system according to some embodiments is shown. The system, as shown includes two domains, a digital domain and an analog domain. The digital domain may include a host 102, chip interconnect 104, registers 106, and an interface 110. The host 102 may be a controller or a processor that may be in communication with the registers 106 via the chip interconnect 104. For example, the host 102 may transmit control signals to the registers 106 in order to trim the sensor chip and tune the chip's functionality. The interface 110 may receive the digital signal data from the registers 106 through the chip interconnect 104 and configure the digital signal data for transmission to the analog domain. The functionality and operation of the interface 110 is described later below.

The level shifter 140 may receive the data to be transmitted, from the interface 110, and convert the voltage to an appropriate voltage in the analog domain. The analog domain includes BARs 122, 124, 126, . . . , 128 that are coupled to the analog registers 130. The BARs 122-128 are blocks of addressable registers where each BAR is associated with a number of registers. For example, each BAR may be associated with 4 registers, 8 registers, etc.

Transmission of data from the digital domain to the analog domain is now described. The interface 110 may access the registers 106 for digital data, e.g., control data, etc. It is appreciated that each BAR in the analog domain may be activated using a select signal. However, it is appreciated that only one BAR may be activated at the time. In some embodiments, the select signal associated with each BAR is transmitted from the digital domain to the analog domain through a communication line that is exclusive to that BAR. For example, BAR 122 may include a communication line that receives a select signal to the BAR 122 from the interface 110 and BAR 124 may include a different communication line that receives a select signal to the BAR 124 from the interface 110, etc. The interface 110 may transmit a select signal to select the desired BAR, e.g., BAR 126, to write data to.

Subsequent to selecting the desired BAR, e.g., BAR 126, the interface 110 may transmit an address associated with the addressable register within the analog registers 130. For example, if the BAR 126 is associated with 4 registers, then two bits are used to select one of the 4 registers. On the other hand, if the BAR 126 is associated with 16 registers, then four bits may be used to select one of 16 registers. It is appreciated that the analog registers 130 may be flipflops, however, in some embodiments latches may be used that have a smaller form factor, thereby reducing the footprint. Once the address is transmitted, the interface 110 broadcasts the data to not only to the desired BAR, e.g., BAR 126, but also to other BARs, e.g., BAR 122, 124, . . . , 128, within the analog domain. It is appreciated that even though the data is being broadcast to not only the desired BAR but also to other BARs, since the select signal only activates one BAR at the time then the data being broadcast is only stored in the intended BAR, e.g., BAR 126, while that data is ignored by other BARs (BARs other than the desired BAR).

It is appreciated that the data may go through the level shifter 140 to adjust the voltage prior to being transmitted to the analog domain. It is also appreciated that the bandwidth used to transmit the address, e.g., 2 bits, 4 bits, etc., may be released and reused for data transmission after the address is transmitted. It is appreciated that the bandwidth may be used for data transmission until the next select signal is asserted, e.g., to select a different BAR. It is further appreciated that the number of BARs, analog registers, etc. shown is for illustrative purposes and should not be construed as limiting the scope of the embodiments.

Accordingly, registers may be positioned in the analog domain instead of the digital domain, thereby reducing the number of communication lines, e.g., wires, needed to transmit data between the digital and analog domains. Furthermore, reducing the number of communication lines also reduces the number of level shifters, which reduces the footprint. As illustrated above, the embodiment employs a configuration without a use of a multiplexer, which further reduces the footprint.

In other words, the embodiments reduce the area and the footprint in a mixed signal system, such as a sensor chip, without sacrificing timing constraints and functionality. Moreover, the embodiments reduce the area by reducing the number of wires, thereby reducing the number of level shifters, as well as limiting or eliminating the use of multiplexers in communication between the digital domain and the analog domain.

Figure 2:
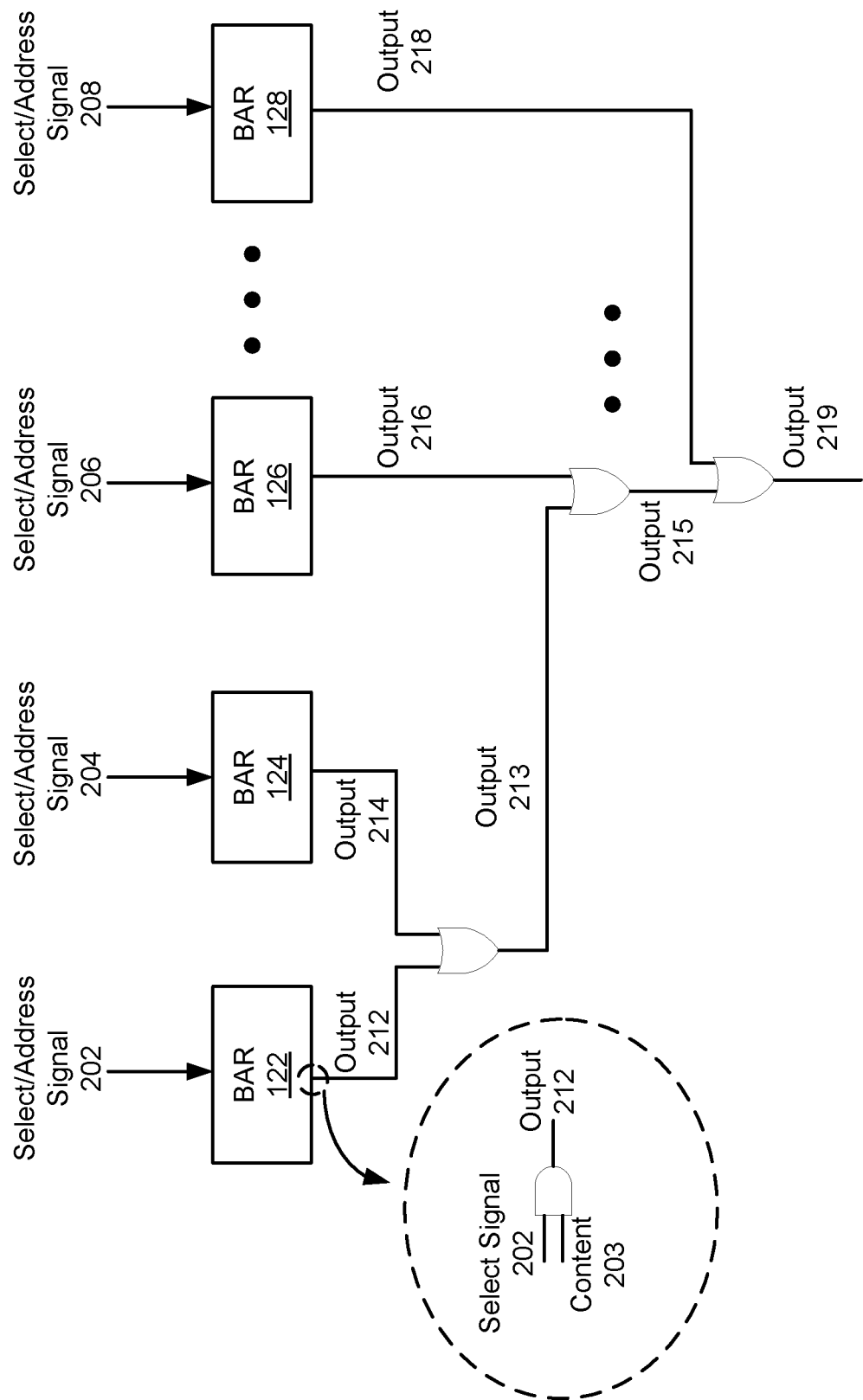
FIG. 2 shows a read operation in the analog domain according to some embodiments.

Referring now to FIG. 2, a read operation in the analog domain according to some embodiments is shown. BARs 122-128, as shown in FIG. 2, are similar to the one described in FIG. 1. Each BAR may receive its corresponding select/address signal 202, 204, 206, . . . , 208. It is appreciated that the select/address signal 202, 204, 206, . . . , 208 may each be one communication line or multiple communication lines, e.g., one communication line for the select signal and another for the address. It is appreciated that only one BAR may be selected at a time. For example, the select/address signal 208 may be asserted to select BAR 128. It is appreciated that the address may be associated with the desired register of the analog registers, as discussed above. For example, the address may be a 2-bit address to select from 4 registers or it may be a 4-bit address to select from 16 registers, etc., to select the appropriate register associated with the selected BAR, e.g., BAR 128.

The select signal associated with each BAR is gated to the content from the BAR. For example, the select signal 202 associated with BAR 122 is gated, e.g., logical AND gate, to its content 203. In this example, because the select signal 202 is not asserted since BAR 128 is selected, the output 212 is zero. Similarly, the selected signal 204 associated with BAR 124 is gated, e.g., logical AND gate, to its content to form output 214, which is zero in this example because BAR 128 is selected.

The outputs 212 and 214 are gated, e.g., logical OR gate, to one another to form output 213. In this example, because the output signals 212 and 214 are both zero the output 213 is zero. Similarly, the select signal 206 associated with BAR 126 is gated, e.g., logical AND gate, to its content to form output 216, which is zero in this example because BAR 128 is selected and only one BAR is active at a time. The outputs 216 and 213 are gated, e.g., logical OR gate, together to form the output 215.

The select signal 208 associated with BAR 128 is gated, e.g., logical AND gate, to its content. In this example, since the BAR 128 is selected, the output 218 is nonzero. It is appreciated that the BAR 128 may also receive the address, as described above, to identify the desired register associated with the selected BAR 128 to read from. For example, the address may be a 2-bit address to select from 4 registers associated with the selected BAR 128, the address may be a 4-bit address to select from 16 registers associated with the selected BAR 128, etc. Accordingly, the output 218 includes the desired data to be read from. The output 218 is gated, e.g., logical OR gate, with output 215. Since the output 215 is zero, as described above, the output 219 of the gate is the content of the addressed register associated with the selected BAR 128.

Accordingly, the output of two or more BARs are gated together to form an output, which is gated to other BARs in a daisy chain configuration fashion until all BARs in the analog domain are gated to one another. It is also appreciated that gating two BARs, as described in FIG. 2, is for illustrative purposes and should not be construed as limiting the scope of the embodiments. For example, in some embodiments 3 BARs may be gated, etc. It is also appreciated that the embodiments are described with respect to a logical AND gate and further a logical OR gate. However, the embodiments should not be construed as limited thereto and other equivalent logical gates may similarly be used.

Accordingly, the embodiments enable efficient data read from the analog domain into the digital domain.

Figure 3:
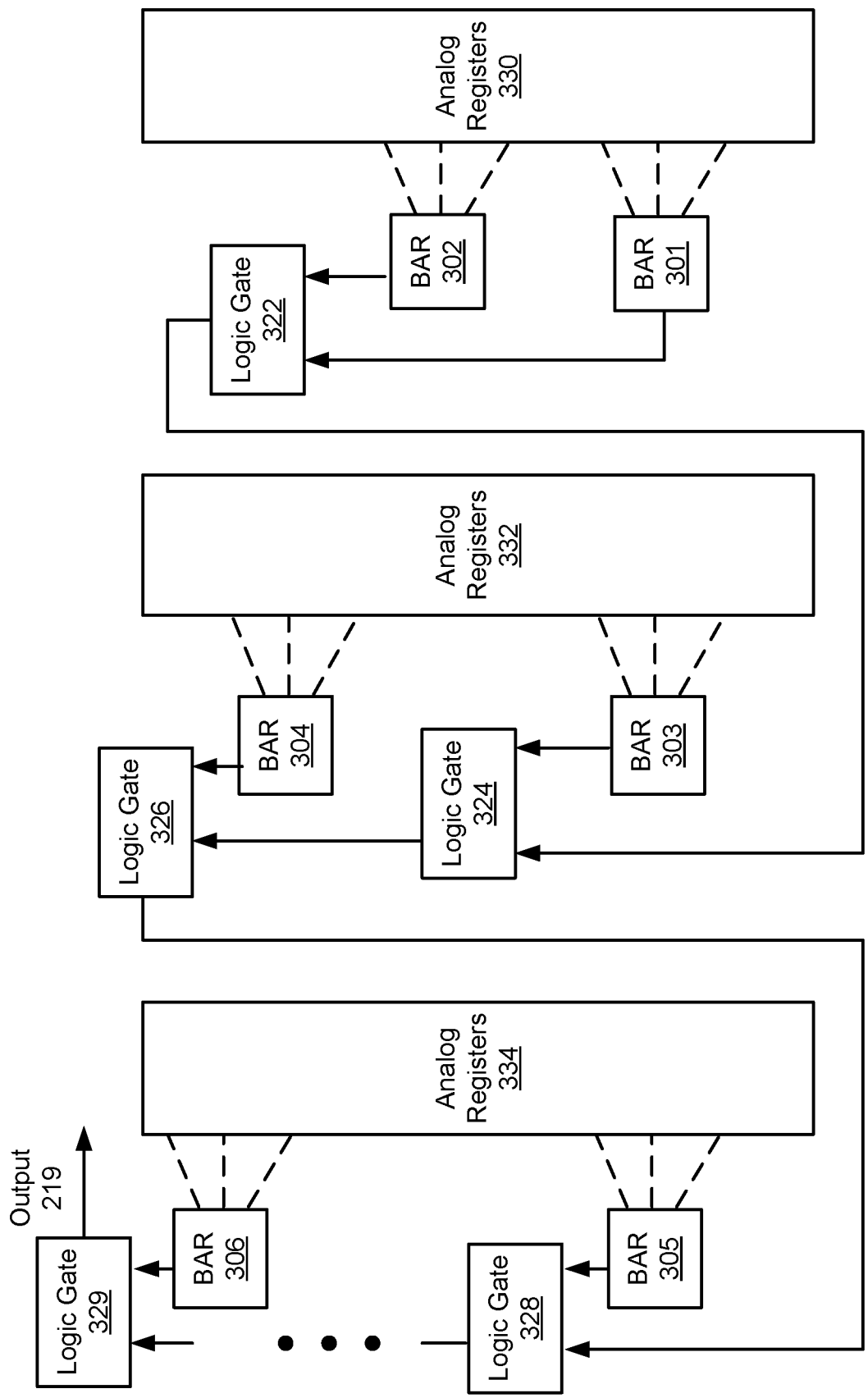
FIG. 3 shows a configuration of the analog domain and its associated read operation according to some embodiments.

Referring now to FIG. 3, a configuration of the analog domain and its associated read operation according to some embodiments is shown. The analog domain may include analog registers 330, 332, 334 as well as BARs 301, 302, 303, 304, 305, . . . , 306. The analog registers and the BARs are similar to the ones described in FIGS. 1 and 2. It is appreciated that each BAR may be associated with a certain number of registers within the analog registers, as described above.

The output of BAR 301 may be formed by gating, e.g., logical AND gate, the select signal with its content, as identified by the address identifying the desired register. Similarly, output of BAR 302 may be formed by gating, e.g., logical AND gate, the select signal with its content, as identified by the address identifying the desired register. It is appreciated that output of other BARs, e.g., BARs 303, 304, 305, . . . , 306, are similarly formed, as described with respect to FIG. 2.

As discussed in FIG. 2, the output of the BARs may be gated together and the output of the gate may be gated to other BARs in order to read from the analog domain into the digital domain. The logic gates 322, 324, 326, 328, . . . , 329 may be a logic OR gate. In this example, the outputs of BARs 301 and 302 are gated, e.g., logic gate 322, together. The output of the logic gate 322 is gated, through logic gate 324, to the BAR 303. The output of logic gate 324 is gated, through logic gate 326, to BAR 304. The output of the logic gate 326 is gated, through logic gate 328, to BAR 305. This process continues for all other BARs, e.g., BAR 306, in the analog domain through other logic gates, e.g., logic gate 329, until the output 219 is formed. The output 219 contains the desired data.

As illustrated, the BARs in the analog domain corresponding to analog registers are coupled to one another through logic gates in a daisy chain configuration. Thus, the output is formed without a need to use a multiplexer. The embodiments, as described, enable efficient data read from the analog domain into the digital domain.

Figure 4:
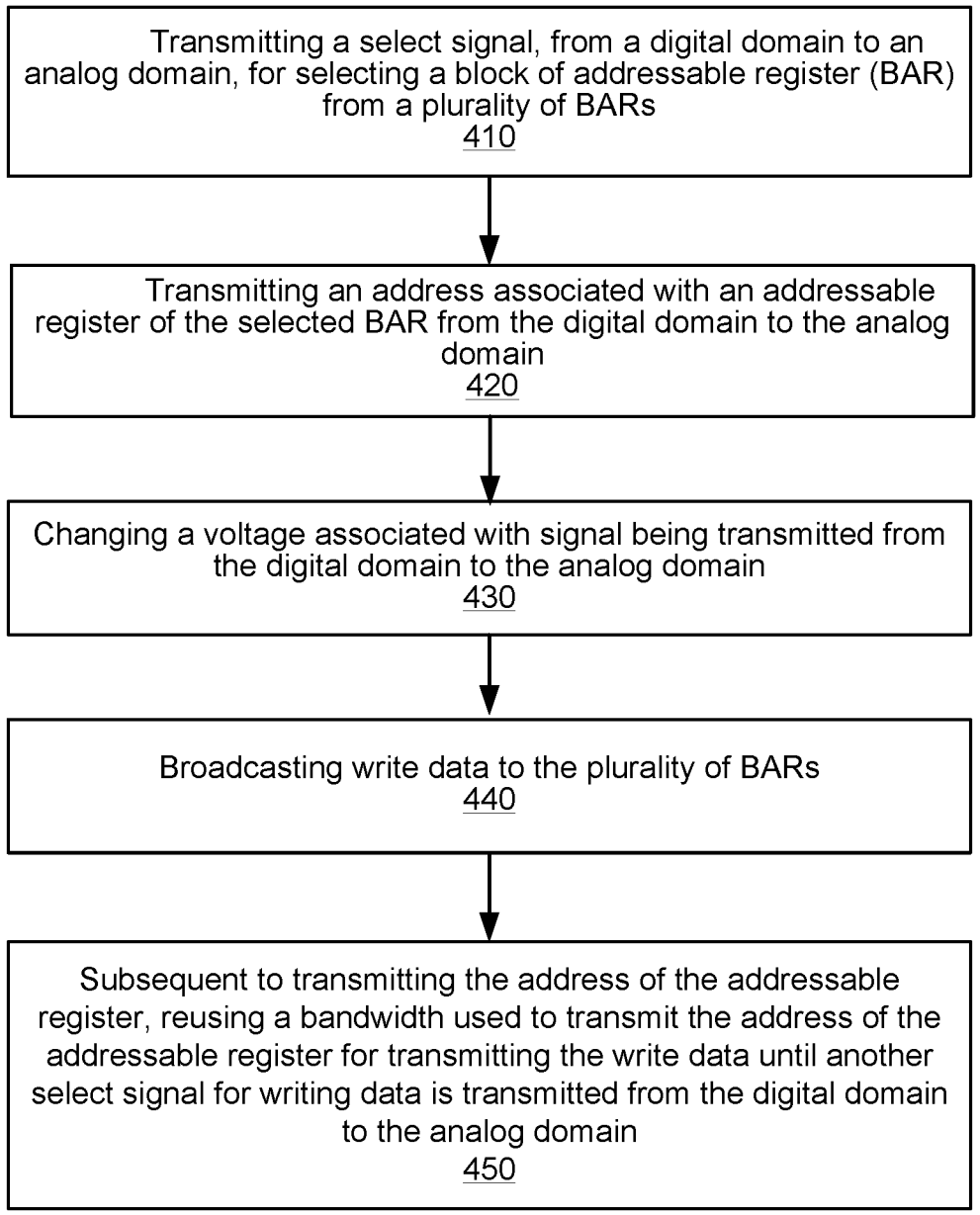
FIG. 4 shows an example of flow diagram for writing from the digital domain into the analog domain according to some embodiments.

Referring now to FIG. 4, an example of flow diagram for writing from the digital domain into the analog domain according to some embodiments is shown. At step 410, a select signal is transmitted form a digital domain to an analog domain, as described in FIG. 1. The select signal selects a desired BAR from a plurality of BARs. At step 420, an address associated with an addressable register for the selected BAR is transmitted, as described in FIG. 1, from the digital domain to the analog domain. At step 430, a voltage associated with the signal being transmitted from the digital domain to the analog domain is changed. At step 440, the data is broadcasts to the plurality of BARs. It is appreciated that the voltage associated with data being transmitted may also be changed when it goes from the digital domain to the analog domain. In some embodiments, at step 450, subsequent to transmitting the address of the addressable register, a bandwidth associated with the address is reused to transmit write data. In some embodiments, the bandwidth is reused for write data until the next select signal is transmitted from the digital domain to the analog domain.

Accordingly, the embodiments reduce the area and the footprint in a mixed signal system, such as a sensor chip, without sacrificing timing constraints and functionality. Moreover, the embodiments reduce the area by reducing the number of wires, thereby the number of level shifters, as well as limiting or eliminating the use of multiplexers in communication between the digital domain and the analog domain.

Figure 5:
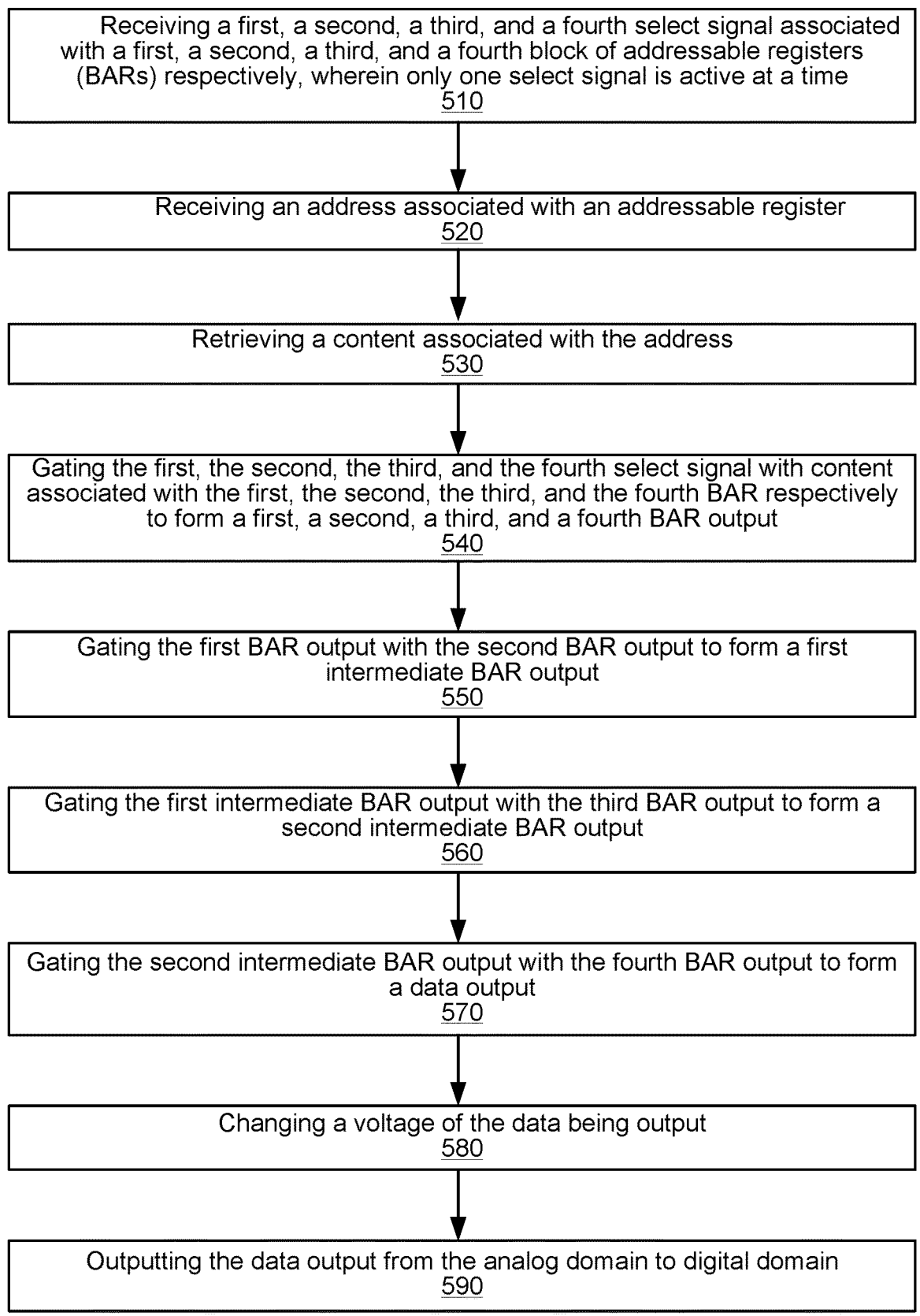
FIG. 5 shows an example of flow diagram for reading from the analog domain into the digital domain according to some embodiments.

Referring now to FIG. 5, an example of flow diagram for reading from the analog domain into the digital domain according to some embodiments is shown. At step 510, a first, a second, a third, and a fourth select signal associated with a first, a second, a third, and a fourth BAR is received, as described in FIGS. 2-3. It is appreciated that only one BAR is selected at a time. Moreover, it is appreciated that the select signals may all have the same value, e.g., zero, except one to designate one BAR as the selected BAR. At step 520, the address associated with the addressable register of the selected BAR is received at the analog domain, e.g., from the digital domain, as described in FIGS. 2-2. The content associated with the address is retrieved from the register, at step 530, as described in FIGS. 2-2. At step 540, the content for each BAR, e.g., a register associated with each BAR, is gated with its associated select signal. For example, the first, the second, the third, and the fourth select signals are gated with content associated with the first, the second, the third, and the fourth BAR respectively to form a first, a second, a third, and a fourth BAR output, as described in FIGS. 2-3.

At step 550, the first BAR output is gate to a second BAR output to form a first intermediate BAR output, as described in FIGS. 2-3. At step 560, the first intermediate BAR output is gated with the third BAR output to form a second intermediate BAR output, as described in FIGS. 2-3. At step 570, the second intermediate BAR output is gated with the fourth BAR output to form a data output. At step 580, a voltage associated with the data output is changed such that the data can be transmitted from the analog domain to the digital domain, as described in FIGS. 2-3. At step 590, the data is output from the analog domain to the digital domain, as described in FIGS. 2-3.

Accordingly, the embodiments enable efficient data read from the analog domain into the digital domain.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A mixed signal system comprising:
   a digital domain; and
   an analog domain comprising a plurality of block of addressable registers (BARs), wherein each BAR of the plurality of BARs comprises at least one or more addressable registers,
   wherein the digital domain comprises an interface configured to communicate with the analog domain, wherein the interface is configured to write data to an addressable register within a BAR of the plurality of BARs in the analog domain by transmitting a first select signal configured to select a first BAR of the plurality of BARs, and wherein the interface is further configured to transmit an address of the addressable register of the first BAR and wherein the interface is further configured to broadcast the write data to the first BAR and further to at least one BAR other than the first BAR of the plurality of BARs, and
   wherein the analog domain is configured to transmit data from a second BAR of the plurality of BARs to the digital domain by gating a select BAR signal associated with each BAR of the plurality of BARs with its corresponding content stored therein to form a respective BAR output and further by gating the respective BAR outputs with one another, wherein gating the select BAR signal associated with the second BAR and its content generates a non-zero respective BAR output and wherein gating the select BAR signal associated with BARs of the plurality of BARs other than the second BAR generates a zero output.

2. The mixed signal system as described in claim 1, wherein at least one logical OR gate is used to gate the respective BAR outputs.

3. The mixed signal system as described in claim 1, wherein the addressable register is a latch.

4. The mixed signal system as described in claim 1, wherein the addressable register is a flipflop.

5. The mixed signal system as described in claim 1, wherein subsequent to transmitting the address of the addressable register, a bandwidth used to transmit the address of the addressable register is used for transmitting data until another select signal for writing data is transmitted from the digital domain to the analog domain.

6. The mixed signal system as described in claim 1, wherein the digital domain further comprises one time programmable memory, and wherein data is communicated from the one time programmable memory to the analog domain through the interface.

7. The mixed signal system as described in claim 1, wherein the respective BAR outputs are gated to one another in a daisy chain configuration wherein at least two respective BAR outputs of the respective BAR outputs are gated to one another and wherein output of the at least two respective BAR outputs is gated to at least another respective BAR output.

8. The mixed signal system as described in claim 1, wherein a select BAR signal associated with each BAR of the plurality of BARs and its corresponding content stored therein are AND gate together.

9. The mixed signal system as described in claim 1 further comprising a level shifter configured to change voltages between the digital and analog domains.

10. A method comprising:
    transmitting a select signal, from a digital domain to an analog domain, for selecting a block of addressable register (BAR) from a plurality of BARs;
    transmitting an address associated with an addressable register of the selected BAR from the digital domain to the analog domain, wherein the selected BAR comprises a plurality of addressable registers; and
    broadcasting write data to the plurality of BARs.

11. The method as described in claim 10, wherein the addressable register is a latch.

12. The method as described in claim 10, wherein the addressable register is a flipflop.

13. The method as described in claim 10 further comprising:
    subsequent to transmitting the address of the addressable register, reusing a bandwidth used to transmit the address of the addressable register for transmitting the write data until another select signal for writing data is transmitted from the digital domain to the analog domain.

14. The method as described in claim 10 further comprising changing a voltage associated with signal being transmitted from the digital domain to the analog domain.

15. A method comprising:
    receiving a first, a second, a third, and a fourth select signal associated with a first, a second, a third, and a fourth block of addressable registers (BARs) respectively, wherein only one select signal is active at a time, and wherein each BAR comprises at least one addressable register, wherein the BARs and the at least one addressable register are within an analog domain;
    receiving an address associated with an addressable register;
    retrieving a content associated with the address;
    gating the first, the second, the third, and the fourth select signal with content associated with the first, the second, the third, and the fourth BAR respectively to form a first, a second, a third, and a fourth BAR output; and
    gating the first BAR output with the second BAR output to form a first intermediate BAR output;
    gating the first intermediate BAR output with the third BAR output to form a second intermediate BAR output;
    gating the second intermediate BAR output with the fourth BAR output to form a data output; and
    outputting the data output from the analog domain to a digital domain.

16. The method as described in claim 15, wherein gating the select signal that is active with corresponding BAR content generates a non-zero output and wherein gating all other select signals with corresponding BAR content generates a zero output.

17. The method as described in claim 15, wherein the first, the second, the third, and the fourth select signal are gated through an AND gate with content associated with the first, the second, the third, and the fourth BAR respectively.

18. The method as described in claim 15, wherein the first BAR output is OR gated with the second BAR output.

19. The method as described in claim 18, wherein the first intermediate BAR output is OR gated with the third BAR output.

20. The method as described in claim 15, further comprising changing a voltage of the data output when outputting the data output from the analog domain to the digital domain.

* * * * *